US008638889B2

(12) United States Patent
Currivan et al.

(10) Patent No.: US 8,638,889 B2
(45) Date of Patent: Jan. 28, 2014

(54) METHOD AND APPARATUS TO IMPROVE ACQUISITION OF A QUADRATURE AMPLITUDE MODULATED (QAM) SIGNAL HAVING A FREQUENCY OFFSET

(75) Inventors: Bruce J. Currivan, Dove Canyon, CA (US); Loke Kun Tan, Newport Coast, CA (US); Thomas Joseph Kolze, Phoenix, AZ (US); Lin He, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 163 days.

(21) Appl. No.: 13/169,965

(22) Filed: Jun. 27, 2011

(65) Prior Publication Data

US 2012/0106678 A1    May 3, 2012

Related U.S. Application Data

(60) Provisional application No. 61/407,647, filed on Oct. 28, 2010.

(51) Int. Cl.
*H04L 27/06* (2006.01)
*H04L 27/00* (2006.01)

(52) U.S. Cl.
USPC .......................................... 375/344; 375/326

(58) Field of Classification Search
USPC ......... 375/316, 322, 324, 325, 326, 340, 344, 375/354, 371, 373, 375, 259, 271; 331/1 R, 331/10, 11, 12, 34, 1 A; 348/725, 735
See application file for complete search history.

(56) References Cited

U.S. PATENT DOCUMENTS

| | | | | |
|---|---|---|---|---|
| 4,157,565 A | * | 6/1979 | Kuniyoshi et al. | 386/274 |
| 4,466,108 A | * | 8/1984 | Rhodes | 375/329 |
| 4,910,470 A | * | 3/1990 | Borth et al. | 331/12 |
| 5,036,296 A | * | 7/1991 | Yoshida | 331/17 |
| 5,909,148 A | * | 6/1999 | Tanaka | 331/2 |
| 6,023,491 A | * | 2/2000 | Saka et al. | 375/326 |
| 7,079,597 B1 | * | 7/2006 | Shiraishi et al. | 375/326 |
| 7,885,323 B2 | | 2/2011 | Currivan et al. | |

OTHER PUBLICATIONS

Godard, D.N., "Self Recovering Equalization and Carrier Tracking in Two-Dimensional Data Communication Systems," *IEEE Transactions on Communications*, vol. COM-28, No. 11, pp. 1867-1875, IEEE, United States (Nov. 1980).

Treichler, J.R. and Agee, B.G., "A New Approach to Multipath Correction of Constant Modulus Signals," *IEEE Transactions on Acoustics, Speech, and Signal Processing*, vol. ASSP-31, No. 2, pp. 459-471, IEEE, United States (Apr. 1983).

(Continued)

*Primary Examiner* — Sam K Ahn
*Assistant Examiner* — Vineeta Panwalkar
(74) *Attorney, Agent, or Firm* — Sterne, Kessler, Goldstein & Fox P.L.L.C.

(57) ABSTRACT

A method and apparatus are described that result in an improved acquisition of a received communication signal containing a large frequency offset. The method and apparatus raises a derotated sequence of data to a power of an integer provide a sinusoidal spectral component. The method and apparatus determines a cross product based upon the sinusoidal spectral component to provide a phase error. The method and apparatus determines an oscillator signal based upon the phase error. The method and apparatus adjusts the received communication signal based upon the oscillator signal to compensate for the large frequency offset to provide the derotated sequence of data.

20 Claims, 9 Drawing Sheets

(56) References Cited

OTHER PUBLICATIONS

Valkama, M. et al., "On the Performance of Interference Canceller Based I/Q Imbalance Compensation," *IEEE Transaction on Acoustics, Speech, and Signal Processing*, vol. 5, pp. 2885-2888, IEEE, United States (Jun. 2000).

Widrow, B. and Stearns, S.D., *Adaptive Signal Processing*, ISBN No. 0-13-004029-0, pp. 302-367, Prentice Hall, United States (1985).

\* cited by examiner

METHOD AND APPARATUS TO IMPROVE ACQUISITION OF A QUADRATURE AMPLITUDE MODULATED (QAM) SIGNAL HAVING A FREQUENCY OFFSET

CROSS-REFERENCE TO RELATED APPLICATIONS

The present application claims the benefit of U.S. Provisional Patent Appl. No. 61/407,647, filed Oct. 28, 2010, which is incorporated herein by reference in its entirety.

BACKGROUND OF THE INVENTION

1. Field of the Invention

The present invention relates to a communications receiver system, and more specifically to the acquisition of a received quadrature amplitude modulated (QAM) signal containing a frequency offset.

2. Related Art

Communication systems require convergence of several signal processing algorithms before a communications receiver can output meaningful data. One such signal processing algorithm uses a timing recovery process to obtain symbol synchronization. Symbol synchronization involves determining a sample frequency and a sample phase of a received symbol. The determination of the sample frequency requires an estimate of a period of the symbol to sample a received communication signal at a correct sampling rate. The determination of the sample phase involves determining the correct time within a symbol period to take a sample.

Commonly, after obtaining symbol synchronization, another signal processing algorithm uses a carrier recovery process to remove unknown frequency offsets from the received communication signal. Ideally, the frequency of an oscillator in the communication receiver will match the frequency of an oscillator used at a communication transmitter. In practice, their frequencies differ. For example, any variation in the oscillator of the communication receiver can cause a frequency difference between these oscillators. When the frequency of the transmitter oscillator differs from the frequency of the receiver oscillator, the process of down-conversion results in an unknown offset in the frequency content of the received communication signal relative to the transmitted communication signal. The receiver may use a carrier recovery loop to remove these unknown frequency offsets from the symbol content of the received communication signal.

However, a conventional carrier recovery process may take a prohibitively long duration to converge, or may simply not converge at all, in the presence of a large unknown frequency offset. For example, a ±300 kHz carrier frequency offset represents a large unknown frequency offset for a quadrature amplitude modulation (QAM) signal in a cable modem. The conventional carrier recovery process requires approximately 100 ms to converge in the presence of this ±300 kHz carrier frequency offset. In a conventional receiver in some applications (such as downstream cable, e.g., DOCSIS) many channels may be required to attempt frequency locking and data acquisition, before finding a channel containing a valid QAM signal, Thus, when a long frequency acquisition time per channel must be accommodated, when multiplied by many, such as hundreds to provide an example, of possible communications channels containing a QAM signal, the convergence time becomes a prohibitively long duration.

What is needed is a carrier recovery process that converges in the presence of the large unknown frequency offset that overcomes the shortcomings descried above. Further aspects and advantages of the present invention will become apparent from the detailed description that follows.

BRIEF DESCRIPTION OF THE FIGURES

The present invention is described with reference to the accompanying drawings.

The present embodiments will now be described with reference to the accompanying drawings. In the drawings, like reference numbers may indicate identical or functionally similar elements.

DETAILED DESCRIPTION OF THE INVENTION

Figure 1:
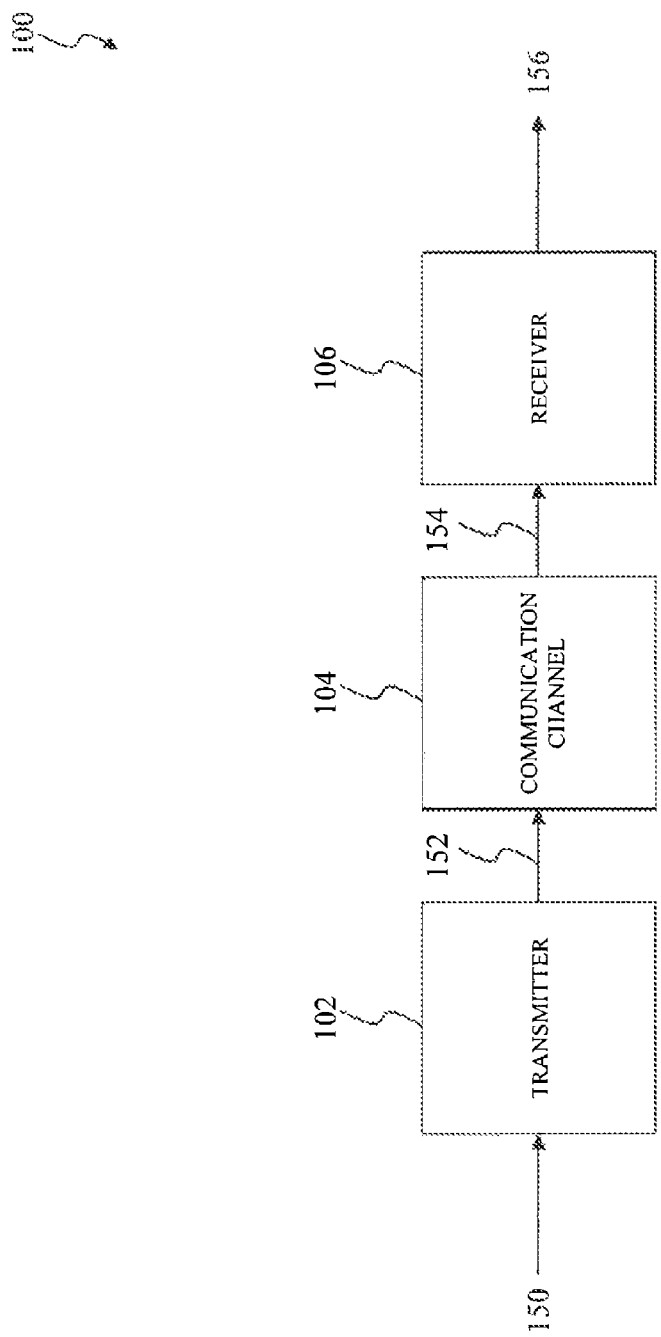
FIG. 1 illustrates a block diagram of a communications environment according to an exemplary embodiment of the present invention.

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Communications Environment

FIG. 1 illustrates a block diagram of a communications environment according to an exemplary embodiment of the present invention. The communications environment 100 includes a communications transmitter 102 to transmit one or more information signals, denoted as one or more data sequences 150, as received from one or more transmitter user devices to a communications receiver 106 via a communications channel 104. The transmitter user devices may include, but are not limited to, personal computers, data terminal equipment, telephony devices, broadband media players, personal digital assistants, software applications, or any other device capable of transmitting or receiving data. The communications transmitter 102 may encode the one or more data sequences 150, modulate the one or more data sequences 150, and/or upconvert the one or more data sequences 150 to a radio frequency (RF) to provide a transmitted communications signal 152. In an exemplary embodiment, the communications transmitter 102 encodes the one or more data sequences 150 according to a quadrature amplitude modulation (QAM) scheme such as 16-QAM, 32-QAM, 64-QAM, 128-QAM, 256-QAM, 512-QAM, or 1024-QAM to provide some examples.

The transmitted communications signal 152 passes through the communications channel 104 to pro vide a received communications signal 154. The communications channel 104 may include, but is not limited to, a microwave radio link, a satellite channel, a fiber optic cable, a hybrid fiber optic cable system, or a copper cable to provide some examples.

The communications receiver 106 observes the received communications signal 154 as it passes through the communications channel 104. The communications receiver 106 determines a most-likely transmitted sequence of the transmitted communications signal 152 to provide one or more recovered information signals, denoted as one or more recovered data sequences 156, for one or more receiver user devices. The receiver user devices may include, but are not limited to, personal computers, data terminal equipment, telephony devices, broadband media players, personal digital assistants, software applications, or any other device capable of transmitting or receiving data.

Ideally, a frequency of one or more oscillators used by the communications receiver 106 should match a frequency of one or more oscillators used by the communications transmitter 102. In this situation, the communications receiver 106 may be characterized as having a best opportunity to determine a most-likely transmitted sequence of the transmitted communications signal 152 from the received communications signal 154. However, in practice, these two frequencies often differ resulting in an unknown frequency offset, thereby degrading the ability of the communications receiver 106 to determine the most-likely transmitted sequence of the transmitted communications signal 152. Herein, the unknown frequency offset, whether small or large, refers to an unknown frequency offset of a received communications signal, such as the received communications signal 154 to provide an example, relative to a transmitted communications signal, such as the transmitted communications signal 152 to provide an example.

The communications receiver 106 includes a carrier recovery loop to implement a carrier recovery process to compensate for this unknown frequency offset. The communications receiver 106 detects and corrects for the unknown frequency offset by adjusting the carrier recovery loop over a range of frequencies until the carrier recovery loop converges. The convergence of the carrier recovery loop indicates the frequency of one or more oscillators used by the communications receiver 106 have been properly adjusted to compensate for the unknown frequency offset. However, in the presence of a large unknown frequency offset, the carrier recovery loop may take a prohibitively long duration to converge or the carrier recovery loop may simply not converge at all.

Conventional Carrier Recovery Loop

Figure 2:
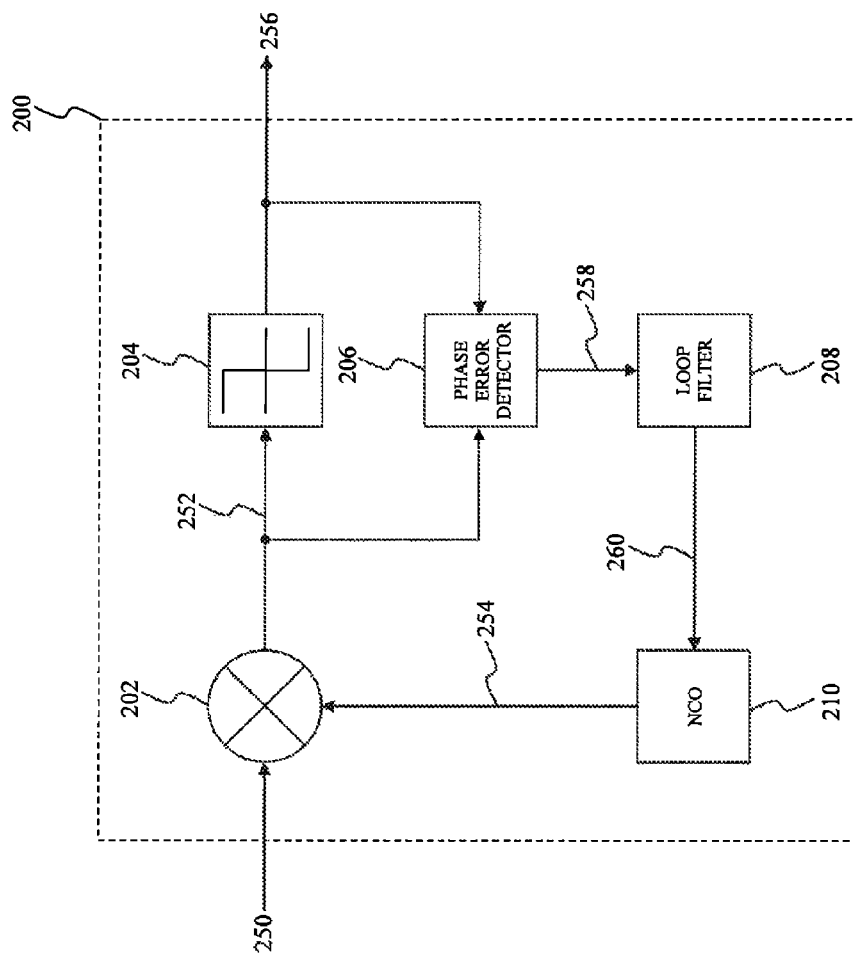
FIG. 2 illustrates a conventional carrier recovery loop.

FIG. 2 illustrates a conventional carrier recovery loop. A conventional carrier recovery loop 200 may take a prohibitively long duration to converge to a substantially constant phase error, or may simply not converge to the substantially constant phase error at all, in the presence of a large unknown frequency offset. Herein, a large unknown frequency offset represents an unknown frequency offset for which the conventional carrier recovery loop 200 may take a prohibitively long duration to converge or may simply not converge at all. For example, a ±300 kHz carrier frequency offset represents a large unknown frequency offset for a QAM signal in a cable modem. The conventional carrier recovery loop 200 requires approximately 100 ms to converge in the presence of this ±300 kHz carrier frequency offset which when multiplied by many, such as hundreds to provide an example, of possible communications channels in the QAM signal becomes a prohibitively long duration. The conventional carrier recovery loop 200 includes a derotator module 202, a slicer module 204, a phase error detection module 206, a loop filter module 208, and a numerically controlled oscillator (NCO) module 210.

The derotator module 202 adjusts an observed communications signal 250 according to an oscillator signal 254 to provide a derotated communication signal 252. The observed communications signal 250 may represent an exemplary embodiment of the received communications signal 154.

The slicer module 204 determines a most-likely transmitted sequence of a transmitted communications signal, such as the transmitted communications signal 152 to provide an example, based upon the derotated communication signal 252 to provide a recovered sequence of data 256. More specifically, the slicer module 204 compares the derotated communication signal 252 to one or more threshold values and assigns a digital value to the recovered sequence of data 256 based upon the comparison. The one or more threshold values may be adjusted according to the encoding of the transmitted communications signal. For example, if the transmitted communications signal is encoded according to a quadrature amplitude modulation (QAM) scheme, each of the one or more threshold values of the slicer module 204 may be assigned to a corresponding point of the QAM constellation. In this example, the slicer module 204 assigns the derotated communication signal 252 to the digital value corresponding to the one or more threshold values closest to the derotated communication signal 252.

The phase error detection module 206 compares the derotated communication signal 252 and the recovered sequence of data 256 to provide a phase error 258. The phase error 258 represents a difference between a phase of the derotated communication signal 252 and a phase of the recovered sequence of data 256. A large value for the phase error 258 represents a large difference in phase between the derotated communication signal 252 and the recovered sequence of data 256 while a small value for the phase error 258 represents a small difference in phase between the derotated communication signal 252 and the recovered sequence of data 256.

The loop filter module 208 filters unwanted noise from the phase error 258 to provide a filtered phase error 260. The loop filter module 208 substantially attenuates those frequency components of the phase error 258 that are greater than its respective cutoff frequency while passing, with little to no attenuation, those frequency components of the phase error 258 that are less than its respective cutoff frequency.

The NCO module 210 provides the oscillator signal 254 based upon the filtered phase error 260. The NCO module 210 adjusts a phase and/or a frequency of the oscillator signal 254 to approximate a phase and/or a frequency of the observed communications signal 250 in the presence of a small unknown frequency offset. However, in the presence of a large unknown frequency offset, the NCO module 210 may not properly adjust the oscillator signal 254 to approximate the observed communications signal 250. In this situation, the phase error 258 which results from this large unknown frequency offset is substantially attenuated by the loop filter module 208; therefore, the filtered phase error 260, in the presence of this large unknown frequency offset, does not accurately represent the large unknown frequency offset.

Conventionally, the cutoff frequency of the loop filter module 208, and consequently a bandwidth of the conventional carrier recovery loop 200, may be increased to accommodate the large unknown frequency offset; however, this adjustment may introduce more unwanted noise into the conventional carrier recovery loop 200. In this situation, increasing the cutoff frequency of the loop filter module 208 in this manner allows more unwanted noise to be impressed onto the oscillator signal 254 by the NCO module 210, thereby degrading the ability of the conventional carrier recovery loop 200 to determine the most-likely transmitted sequence of the transmitted communications signal.

First Exemplary Embodiment of a Carrier Recovery Loop

Figure 3A:
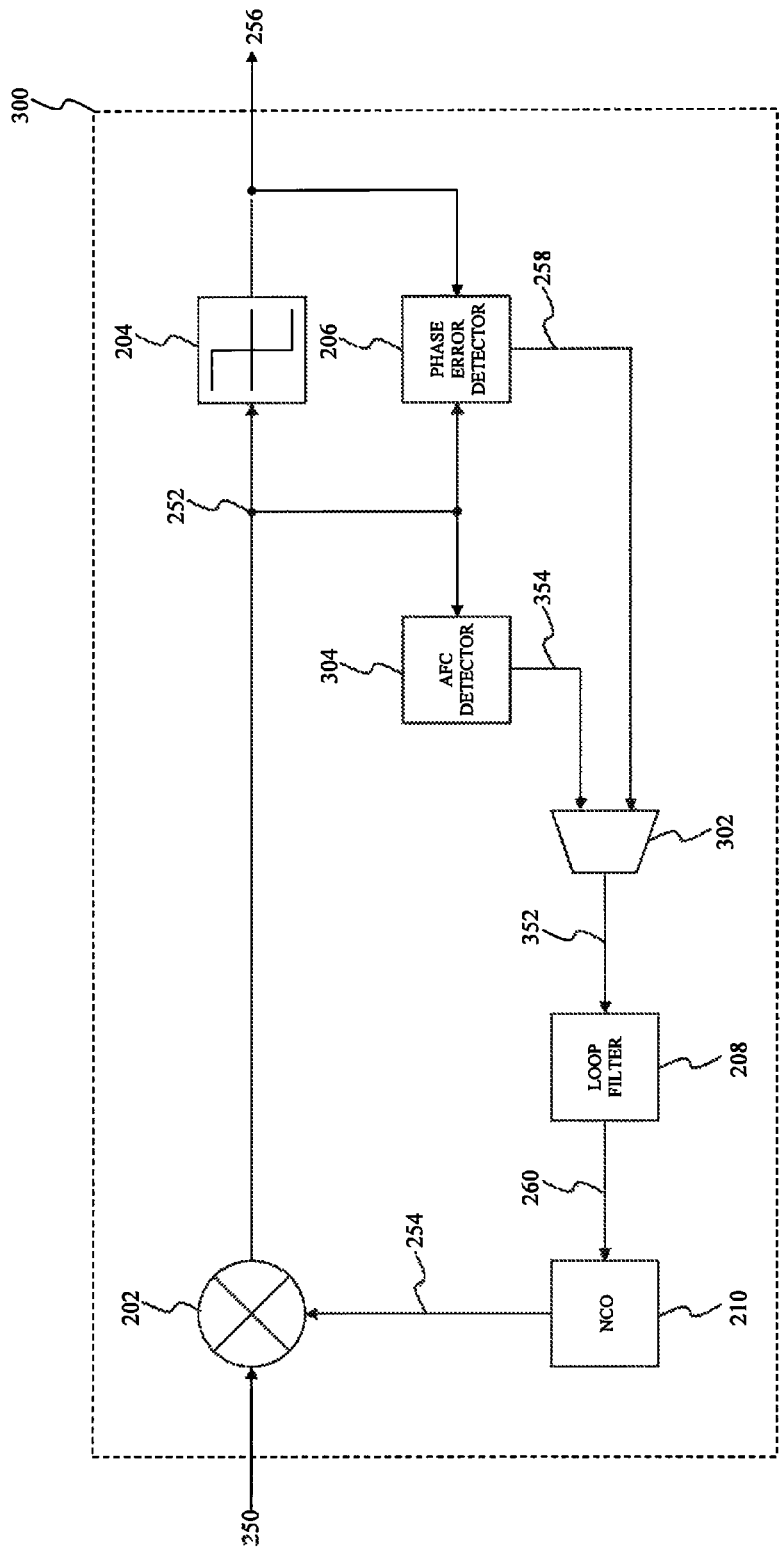
FIG. 3A illustrates a block diagram of a first carrier recovery loop according to an exemplary embodiment of the present invention.

FIG. 3A illustrates a block diagram of a first carrier recovery loop according to an exemplary embodiment of the present invention. A carrier recovery loop 300 may be characterized as operating in one of a first recovery mode of operation to compensate for a small unknown frequency offset and a second recovery mode of operation to compensate for a large unknown frequency offset. In the first recovery mode of operation, the carrier recovery loop 300 compensates for the small unknown frequency offset in the observed communications signal 250. However, when operating in the first recovery mode of operation for the large unknown frequency offset, the carrier recovery loop 300 may take a prohibitively long duration to converge to a substantially constant phase error, or simply may not converge to the substantially constant phase error, in the presence of the large unknown frequency offset. In this situation, the carrier recovery loop 300 operates in the second recovery mode of operation to coarsely compensate for this large unknown frequency offset, thereby transforming the large unknown frequency offset into a small unknown frequency offset. The carrier recovery loop 300 may compensate for this small unknown frequency offset in the second recovery mode of operation or revert to the first recovery mode of operation. The carrier recovery loop 300 includes the derotator module 202, the slicer module 204, the phase error detection module 206, the loop filter module 208, the numerically controlled oscillator (NCO) module 210, a mode selector module 302, and an automatic frequency control (AFC) detector module 304.

Some features of the carrier recovery loop 300 are substantially similar to features of the conventional carrier recovery loop 200 as discussed above; therefore, only differences between the conventional carrier recovery loop 200 and the carrier recovery loop 300 are to be discussed in further detail.

The mode selector module 302 selects the first recovery mode of operation or the second recovery mode of operation. The first recovery mode of operation, also referred to a fine acquisition mode of operation, is selected to compensate for the small unknown frequency offset. The second recovery mode of operation, also referred to a coarse mode of operation, is selected to compensate for the large unknown frequency offset and/or the small unknown frequency offset. In the first recovery mode of operation, the carrier recovery loop 300 operates in a substantially similar manner as the conventional carrier recovery loop 200 as discussed above. In this mode of operation, the carrier recovery loop 300 is configured and arranged such that the mode selector module 302 provides the phase error 258 from the phase error detection module 206 as a selected phase error 352. The loop filter 208 filters unwanted noise from the selected phase error 352 to provide the filtered phase error 260 to be used by the NCO module 210 to provide the oscillator signal 254.

However, in the presence of the large unknown frequency offset, the NCO module 210 may not properly adjust the oscillator signal 254 to approximate the observed communications signal 250 in the first recovery mode of operation. In this situation, the mode selector module 302 selects the second recovery mode of operation to compensate for the large unknown frequency offset. In the second recovery mode of operation, the carrier recovery loop 300 is configured and arranged such that the mode selector module 302 provides a second phase error 354 from the AFC detector module 304, to be described below, as the selected phase error 352. The carrier recovery loop 300 may continue to operate in the second recovery mode of operation until the oscillator signal 254 has sufficiently been adjusted to transform the large unknown frequency offset into the small unknown frequency offset, wherein the mode selector module 302 may remain in the second recovery mode of operation to compensate for this small unknown frequency offset or select the first recovery mode of operation to compensate for this small unknown frequency offset.

Figure 3B:
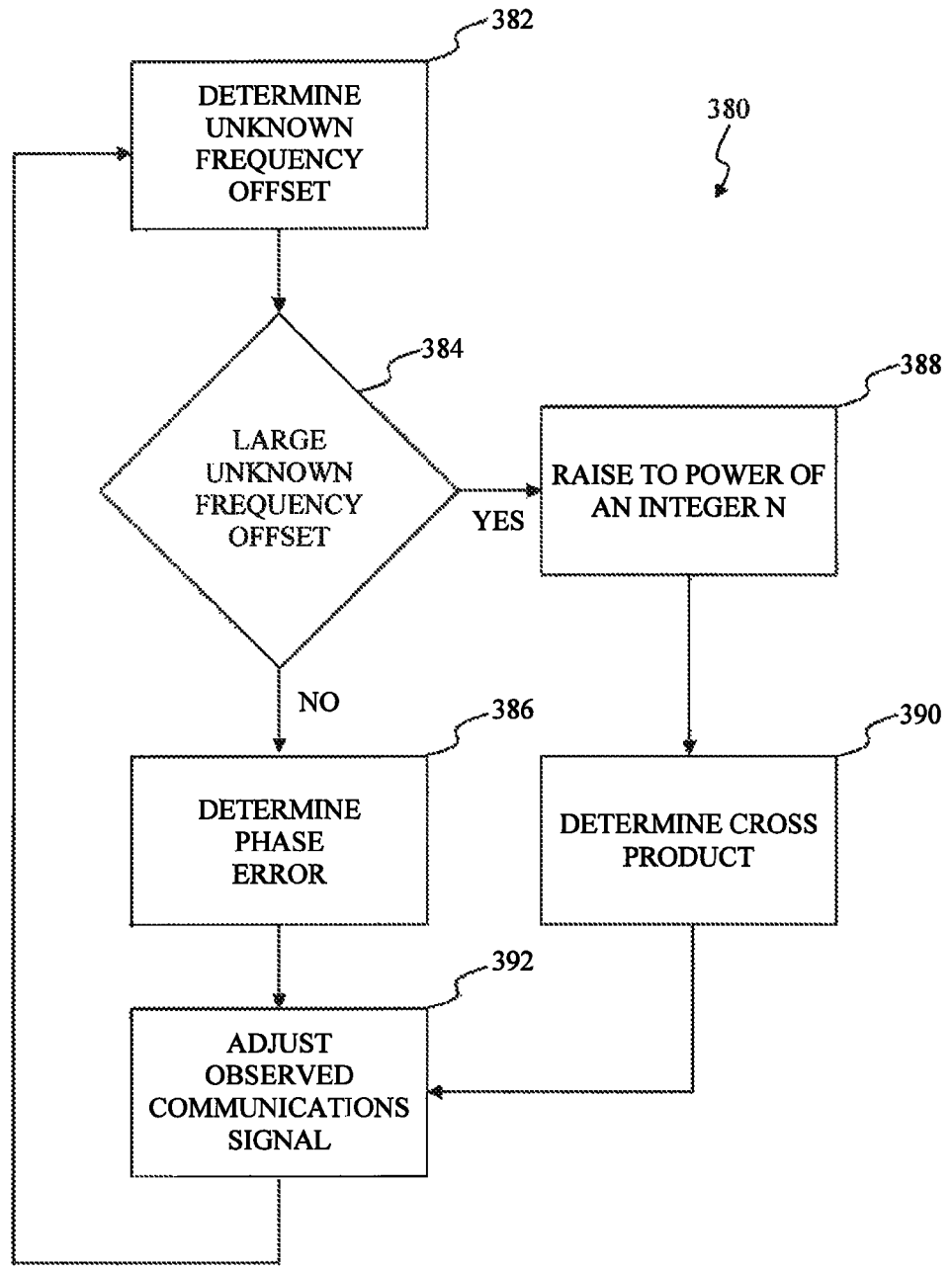
FIG. 3B is a flowchart of exemplary operational steps of the first carrier recovery loop module of the communications receiver according to an exemplary embodiment of the present invention.

FIG. 3B is a flowchart 380 of exemplary operational steps of the first carrier recovery loop module of the communications receiver according to an exemplary embodiment of the present invention. The invention is not limited to this operational description. Rather, it will be apparent to persons skilled in the relevant art(s) from the teachings herein that other operational control flows are within the scope and spirit of the present invention. The following discussion describes the steps in FIG. 3B.

At step 382, the operational control flow determines an unknown frequency offset embedded within a received communication signal, such as the observed communications signal 250 to provide an example.

At step 384, the operational control flow determines whether the unknown frequency offset from step 382 is a large frequency offset or a small frequency offset. The operational control flow proceeds to step 386 for the small frequency offset or to step 388 for the large frequency offset.

At step 386, the operational control flow determines a phase difference between a most-likely transmitted sequence of a transmitted communications signal, such as the transmitted communications signal 152 to provide an example, and the received communication signal from step 382 to determine a phase error.

At step 388, the operation control flow raises the received communication signal from step 382 to a power of an integer N. In an exemplary embodiment, the integer N is four; however, this example is not limiting, those skilled in the relevant art(s) will recognize that any other suitable integer may be used from the teachings herein without departing from the spirit and scope of the present invention.

At step 390, the operational control flow determines a cross product of successive samples of the signal from step 388, the cross product being proportional to a phase difference or error between successive samples of the signal from step 388. The amplitude of the successive samples varies depending on the sequence of transmitted QAM symbols, and this introduces variation, also referred to as self-noise or data-pattern-dependent noise, into the cross product result, in addition to the dependency upon phase difference between the successive samples. The filtering and closed loop operation serve to reduce the impact of the amplitude variations.

At step 392, the operational control flow adjusts the received communication signal from step 382 based upon either the phase error from step 386 for the small unknown frequency offset or the cross product from step 390 for the large unknown frequency offset. The operational control flow adjusts a phase and/or a frequency of the received communication signal from step 382 to compensate for the unknown frequency offset determined in step 382. The operational control flow reverts back to step 382.

Figure 4A:
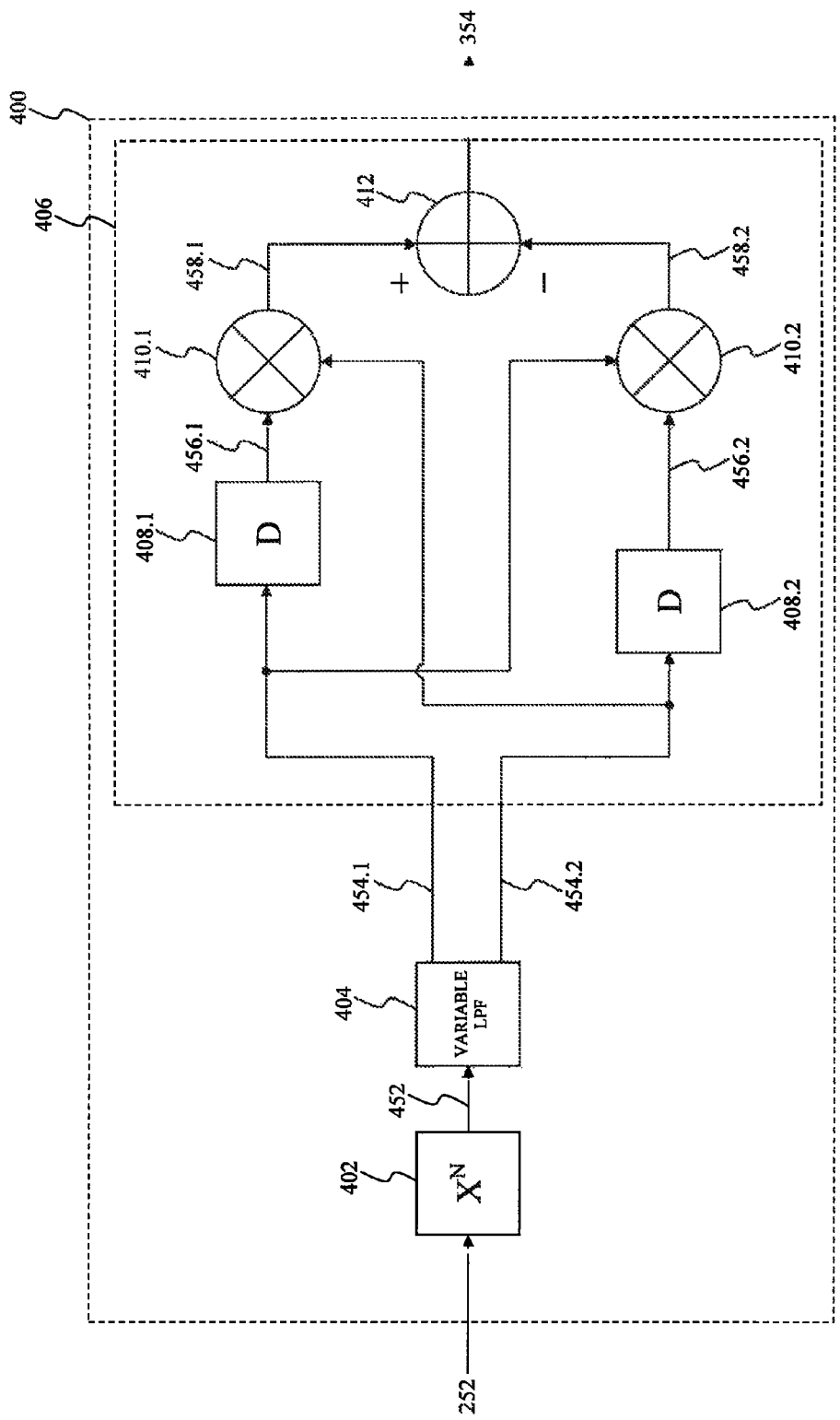
FIG. 4A illustrates a first block diagram of an automatic frequency control (AFC) detector module used in the carrier recovery loop according to an exemplary embodiment of the present invention.

First Exemplary Embodiment of an Automatic Frequency Control (AFC) Detector Module Used in the First Exemplary Embodiment of the Carrier Recovery Loop FIG. 4A illustrates a first block diagram of an automatic frequency control (AFC) detector module used in the carrier recovery loop according to an exemplary embodiment of the present invention. An AFC detector module 400 is used to provide the second phase error 354 based upon the derotated sequence of data 252 in the second recovery mode of operation, namely in the presence of the large unknown frequency offset. The AFC detector module 400 includes a transform unit 402, a variable low pass filter (LPF) module 404, and a cross product detector 406. The AFC detector module 400 may represent an exemplary embodiment of the AFC detector module 304.

The transform unit 402 raises the derotated sequence of data 252 by a power of an integer N to provide a sinusoidal spectral component 452. In an exemplary embodiment, the integer N is four; however, this example is not limiting, those skilled in the relevant art(s) will recognize that any other suitable integer may be used from the teachings herein without departing from the spirit and scope of the present invention. Those skilled in the relevant art(s) will appreciate that the application of exponentiation by the integer N is (in the general case) not wiping off or collapsing all of the phase variation of the QAM signal, but is sufficient to produce a spectral "line". The transform unit 402 is described in further detail below.

The variable LPF module 404 filters unwanted noise including self-noise from the sinusoidal spectral component 452 to provide an in-phase filtered spectral component 454.1 and a quadrature-phase filtered spectral component 454.2. In an exemplary embodiment, the variable LPF module 404 initially has sufficient bandwidth to pass the sinusoidal spectral component 452 and a spectrum of frequencies that are proportional to the large unknown frequency offset. However, as the AFC detector module 400 transforms the large unknown frequency offset into the small unknown frequency offset, the spectrum of frequencies that are occupied by the large unknown frequency offset is reduced, thereby allowing the bandwidth of the variable LPF module 404 to be reduced accordingly. Typically, the bandwidth of the variable LPF module 404 is reduced as a function of time, such as a function of the derotated sequence of data 252 to provide an example; however, any other means to reduce the bandwidth are possible that will be apparent from those skilled in the relevant art(s) from the teachings herein without departing from the spirit and scope of the present invention.

The cross product detector 406 determines a cross product of successive samples of the in-phase filtered spectral component 454.1 and the quadrature-phase filtered spectral component 454.2 to provide the second phase error 354, the cross product being proportional to a phase difference or error between the successive samples of the in-phase filtered spectral component 454.1 and the quadrature-phase filtered spectral component 454.2. The cross product detector 406 includes delay modules 408.1 and 408.2, multiplier modules 410.1 and 410.2, and a summation module 412. The delay modules 408.1 and 408.2 delay the in-phase filtered spectral component 454.1 and the quadrature-phase filtered spectral component 454.2, respectively, by one or more samples to allow for calculation of the cross product of previous samples of the in-phase filtered spectral component 454.1 and the quadrature-phase filtered spectral component 454.2, respectively, to provide delayed spectral components 456.1 and 456.2. The multiplier modules 410.1 and 410.2 multiply the delayed spectral components 456.1 and 456.2 by the quadrature-phase filtered spectral component 454.2 and the in-phase filtered spectral component 454.1, respectively, to provide cross products 458.1 and 458.2, respectively. The summation module 412 subtracts the cross product 458.2 from the cross product 458.1 to provide the second phase error 354. Those skilled in the relevant art(s) will appreciate the application of both the cross-over multiply as a simple phase detector operating on signal which may contain at least some phase modulation, and exponentiation which is producing a spectral line, but intentionally leaves residual phase and/or amplitude modulation.

Figure 4B:
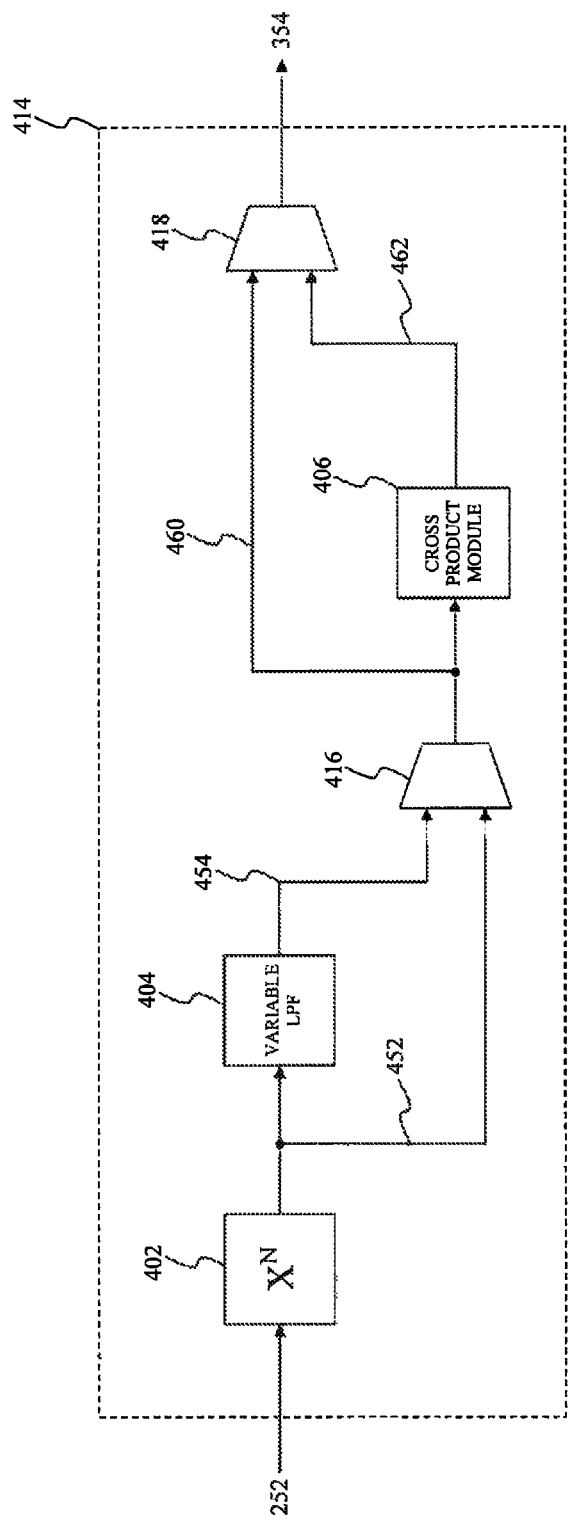
FIG. 4B illustrates a second block diagram of the AFC detector module used in the carrier recovery loop according to an exemplary embodiment of the present invention.

Second Exemplary Embodiment of the AFC Detector Module Used in the First Exemplary Embodiment of the Carrier Recovery Loop FIG. 4B illustrates a second block diagram of the AFC detector module used in the carrier recovery loop according to an exemplary embodiment of the present invention. An AFC detector module 414 is used to provide the second phase error 354 based upon the derotated sequence of data 252 in the second recovery mode of operation, namely in the presence of the large unknown frequency offset. In this exemplary embodiment, the AFC detector module 414 may be characterized as operating in one of a first detector mode of operation corresponding to a coarse acquisition and a second detector mode of operation corresponding to a fine acquisition. The AFC detector module 414 operates in the first detector mode of operation to coarsely transform the large unknown frequency offset into the small unknown frequency offset. When the large unknown frequency offset sufficiently approaches the small unknown frequency offset, the AFC detector module 414 begins to operate in the second detector mode of operation to finely adjust the small unknown frequency offset. In an exemplary embodiment, the large unknown frequency offset sufficiently approaches the small unknown frequency offset when the phase difference or error between the successive samples of the filtered spectral component 454 is approximately zero. The AFC detector module 414 includes the transform unit 402, the variable LPF module 404, the cross product detector 406, a first selection module 416 and a second selection module 418. The AFC detector module 414 may represent an exemplary embodiment of the AFC detector module 304.

Some features of the AFC detector module 414 are substantially similar to features of the AFC detector module 400; therefore, only differences between the AFC detector module 400 and the AFC detector module 414 are to be discussed in further detail.

The first selection module 416 selects the first detector mode of operation to coarsely adjust the large unknown frequency offset to the small unknown frequency offset or the second detector mode of operation to finely adjust the small unknown frequency offset. In the first detector mode of operation, the AFC detector module 414 operates in a substantially similar manner as the AFC detector module 400 as discussed above. In this detector mode of operation, the AFC detector module 414 is configured and arranged such that the first selection module 416 provides the filtered spectral component 454 from the variable LPF module 404 as a selected sequence of data 460. In the second detector mode of operation, the AFC detector module 414 is configured and arranged such that the first selection module 416 provides the sinusoidal spectral component 452 as the selected sequence of data 460.

The second selection module 418 selects the first detector mode of operation to coarsely adjust the large unknown frequency offset to the small unknown frequency offset or the second detector mode of operation to finely adjust the small unknown frequency offset. In the first detector mode of operation, the AFC detector module 414 operates in a substantially similar manner as the AFC detector module 400 as discussed above. In this detector mode of operation, the AFC detector module 414 is configured and arranged such that the second selection module 418 provides a coarse phase error 462 from the cross product detector 406 as the second phase error 354. In the second detector mode of operation, the AFC detector module 414 is configured and arranged such that the second selection module 418 provides the selected sequence of data 460 as the second phase error 354.

It should be noted that the first selection module 416 and the second selection module 418 need not operate in the same detector mode of operation. For example, the first selection module 416 may be operating in the first detector mode of operation while the second selection module 418 is operating in the second detector mode of operation.

Figure 5:
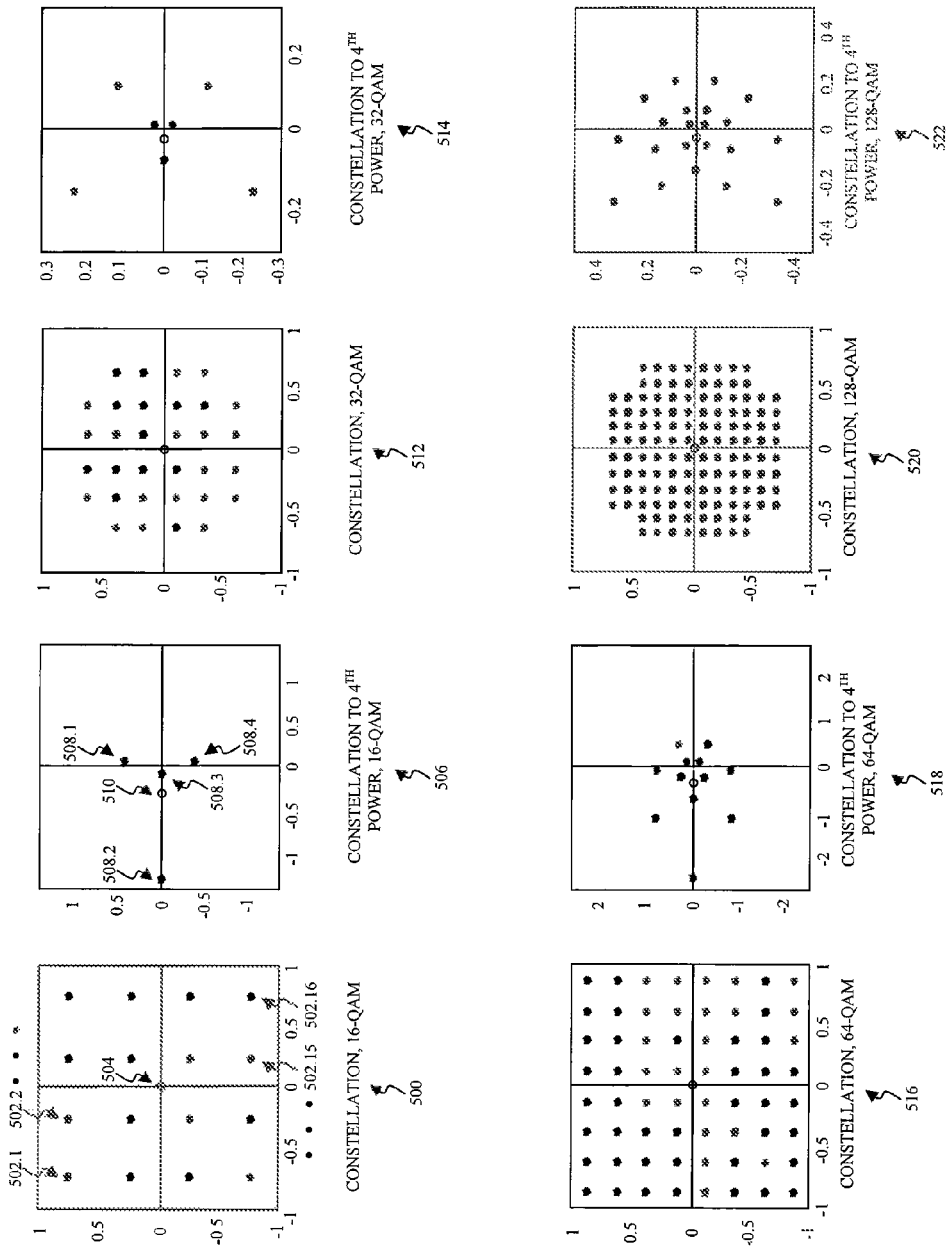
FIG. 5 graphically illustrates an operation of a transform unit used in the first and the second exemplary embodiments of the AFC detector module according to an exemplary embodiment of the present invention.

Exemplary Embodiment of a Transform Unit Used in the First and the Second Exemplary Embodiments of the AFC Detector Module FIG. 5 graphically illustrates an operation of a transform unit used in the first and the second exemplary embodiments of the AFC detector module according to an exemplary embodiment of the present invention. From the discussion above, a transform unit, such as the transform unit 402 to provide an example, raises a sequence of data, such as the derotated sequence of data 252 to provide an example, to a power of an integer N to provide a sinusoidal spectral component along with self-noise, in general. In the exemplary diagrams demonstrated in FIG. 5, the transform unit raises the sequence of data to a power of four to provide the sinusoidal spectral component; however, this example is not limiting, those skilled in the relevant art(s) will recognize that any other suitable integer may be used to produce similar diagrams as to those illustrated in FIG. 5 from the teachings herein without departing from the spirit and scope of the present invention.

For example, a constellation diagram 500 for a 16-quadrature amplitude modulation (16-QAM) constellation pattern is illustrated on a complex plane, wherein the horizontal axis represents the real axis and the vertical axis represents the imaginary axis. The constellation points 502.1 through 502.16 in the constellation diagram 500 corresponds to a possible transmitted symbol of a transmitted communications signal, such as the transmitted communications signal 152 to provide an example. As the symmetry of the constellation points 502 indicates, these constellation points are centered on an origin of the complex plane, and accordingly a mean value 504 of the constellation points 502.1 through 502.16 is approximately zero.

However, raising the constellation points 502.1 through 502.16 to a power of four raises each of the constellation points 502.1 through 502.16 to the fourth power. Accordingly, an amplitude of the complex value for each of the constellation points 502.1 through 502.16 has been raised to the fourth power while a phase of the complex value for each of the constellation points 502.1 through 502.16 has been multiplied by four. As a result, the distribution of the constellation points 502.1 through 502.16 in the complex plane is no longer symmetric around the origin of the complex plane. Rather, as shown in the constellation diagram 506, the re-distributed constellation points 508.1 through 508.4 have been re-distributed with a re-distributed mean 510 that is no longer centered on the origin of the complex plane.

As further illustrated in the constellation diagram 506, the re-distributed constellation points 508.1, 508.3, and 508.4, namely the innermost symbol locations, are redistributed closer to the origin. Similarly, the re-distributed constellation points 508.2, namely the outermost symbol locations, also migrate towards the origin but far less significantly than the innermost symbol locations. More importantly, the angular location of the symbols is redistributed with a predisposition towards the negative imaginary axis.

Instead of viewing the re-distributed constellation points 508.1 through 508.4 in the complex domain, these constellation points may be analyzed in a frequency domain. In the frequency domain, a non-zero value of the re-distributed mean 510 of the re-distributed constellation points 508.1 through 508.4 equates to a direct current (DC) component. If a frequency offset $f_0$ is present in the transmitted communications signal, then this frequency offset $f_0$ causes the constellation points 502.1 through 502.16 to rotate or spin at a rate of $f_0$. Consequently, the re-distributed constellation points 508.1 through 508.4 spin at a rate $4f_0$, and, therefore, the frequency spectrum of the re-distributed constellation points 508.1 through 508.4 contains a component at the frequency of $4f_0$. Such a sinusoidal component can be tracked by an AFC detector module, such as the AFC detector module 400 or the AFC detector module 414 to provide some examples, to provide the basis by which improved signal acquisition can take place.

Similar constellation diagrams for other types of QAM modulation are also illustrated in FIG. 5 and their corresponding re-distributed constellation points. For example, a constellation diagram 512 illustrates a constellation diagram for 32-QAM and a constellation diagram 514 illustrates a redistributed constellation of by raising the 32-QAM to a power of four. As another example, a constellation diagram 516 illustrates a constellation diagram for 64-QAM and a constellation diagram 518 illustrates a re-distributed constellation of by raising the 64-QAM to the power of four. As a further example, a constellation diagram 520 illustrates a constellation diagram for 128-QAM and a constellation diagram 522 illustrates a re-distributed constellation of by raising the 128-QAM to the power of four. Other constellation diagrams for other types of QAM modulation, such as 256-QAM, 512-QAM, and 1024-QAM to provide some examples, and their corresponding re-distributed constellation points are possible that will apparent to those skilled in the relevant art(s) from the teachings herein without departing from the spirit and scope of the present invention.

Exemplary Embodiment of a Second Carrier Recovery Loop

Figure 6:
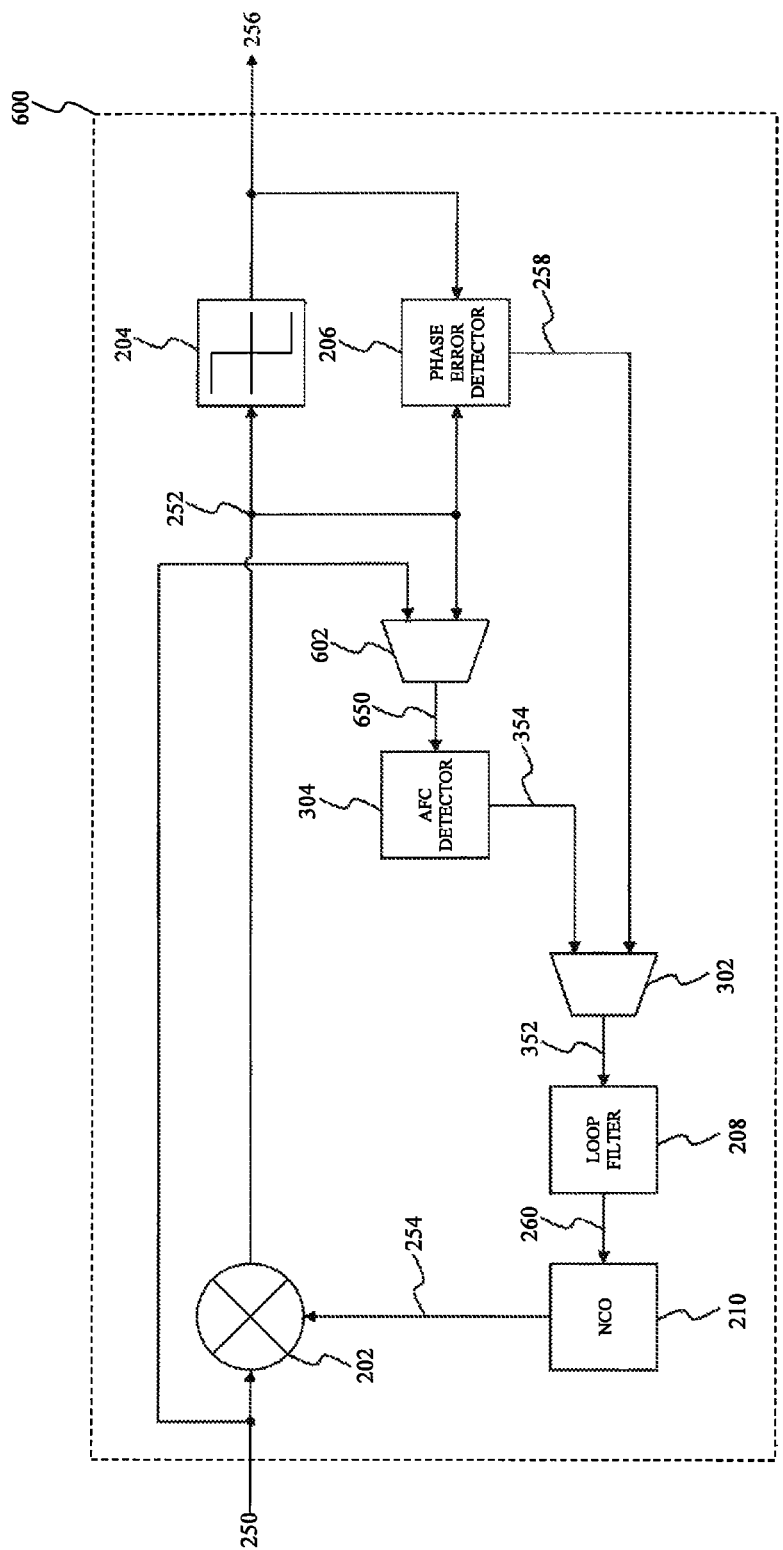
FIG. 6 illustrates a block diagram of a second carrier recovery loop according to an exemplary embodiment of the present invention.

FIG. 6 illustrates a block diagram of a second carrier recovery loop according to an exemplary embodiment of the present invention. A carrier recovery loop 600 may be characterized as operating in one of the first recovery mode of operation to compensate for the small unknown frequency offset and the second recovery mode of operation to compensate for the large unknown frequency offset. In the first recovery mode of operation, the carrier recovery loop 600 compensates for the small unknown frequency offset in the observed communications signal 250. However, when operating in the first recovery mode of operation for the large unknown frequency offset, the carrier recovery loop 600 may take a prohibitively long duration to converge to a substantially constant phase error, or simply may not converge to the substantially constant phase error, in the presence of the large unknown frequency offset. In this situation, the carrier recovery loop 600 operates in the second recovery mode of operation to coarsely compensate for this large unknown frequency offset, thereby transforming the large unknown frequency offset into a small unknown frequency offset. The carrier recovery loop 600 may compensate for this small unknown frequency offset in the second recovery mode of operation or revert to the first recovery mode of operation. The carrier recovery loop 600 includes the derotator module 202, the slicer module 204, the phase error detection module 206, the loop filter module 208, the numerically controlled oscillator (NCO) module 210, the mode selector module 302, the AFC detector module 304, and an input selector module 602.

Some features of the carrier recovery loop 600 are substantially similar to features of the carrier recovery loop 300 as discussed above; therefore, only differences between the carrier recovery loop 300 and the carrier recovery loop 600 are to be discussed in further detail.

The input selector module 602 provides either the observed communications signal 250 or the derotated sequence of data 252 as an AFC detector module input 650. The input selector module 602 allows either the observed communications signal 250, prior to being de-rotated by the derotator module 202, or the derotated sequence of data 252, after being de-rotated by the derotator module 202, to be used as the input for the AFC detector module input 650.

Exemplary Embodiment of a Third Carrier Recovery Loop

Figure 7:
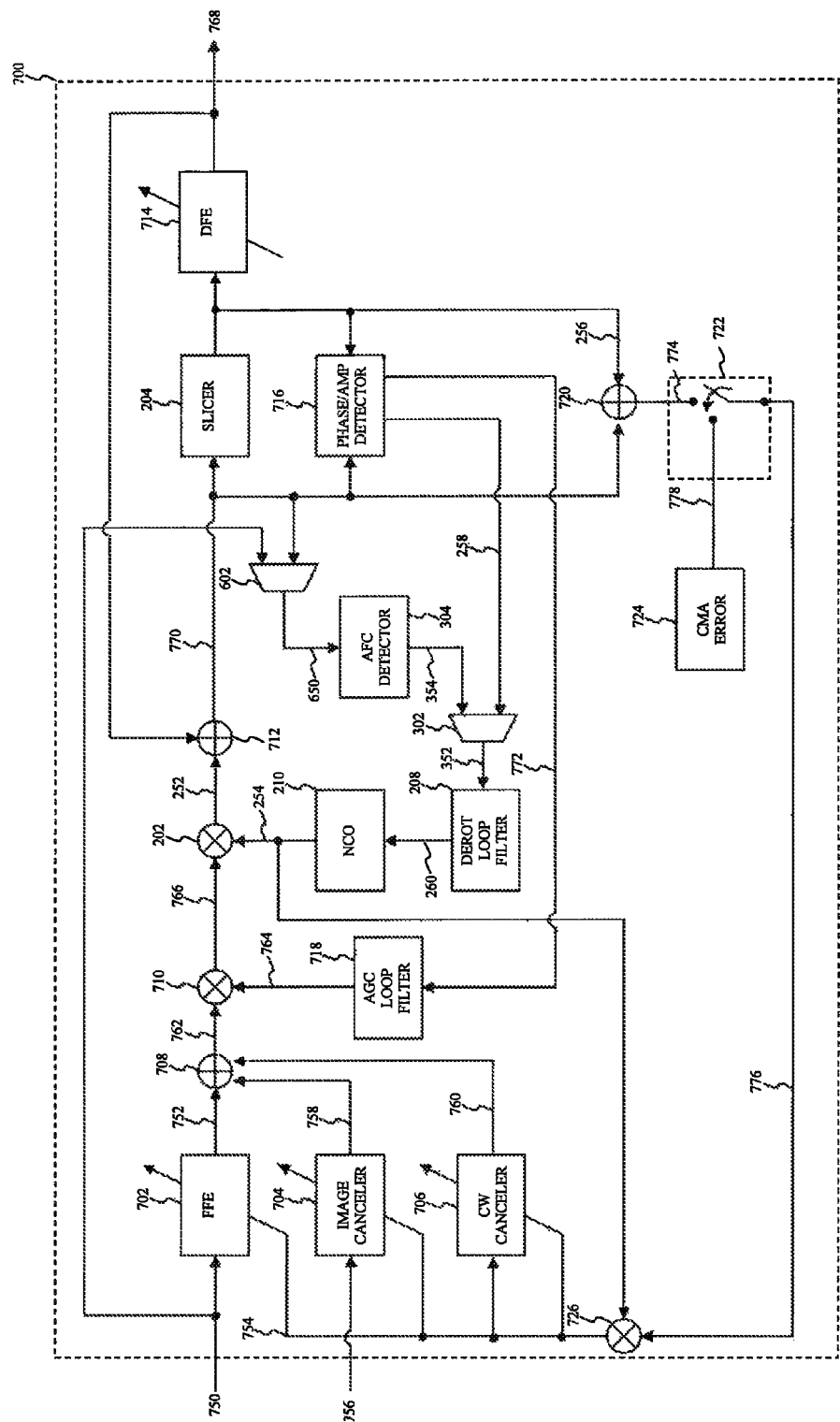
FIG. 7 illustrates a block diagram of a third carrier recovery loop according to an exemplary embodiment of the present invention.

FIG. 7 illustrates a block diagram of a third carrier recovery loop according to an exemplary embodiment of the present invention. A carrier recovery loop 700 may be characterized as operating in one of a first recovery mode of operation to compensate for a small unknown frequency offset and a second recovery mode of operation to compensate for a large unknown frequency offset. In the first recovery mode of operation, the carrier recovery loop 700 compensates for the small unknown frequency offset in a desired communications channel 750. However, when operating in the first recovery mode of operation for the large unknown frequency offset, the carrier recovery loop 700 may take a prohibitively long duration to converge to a substantially constant phase error, or simply may not converge to the substantially constant phase error, in the presence of the large unknown frequency offset. In this situation, the carrier recovery loop 700 operates in the second recovery mode of operation to coarsely compensate for this large unknown frequency offset, thereby transforming the large unknown frequency offset into a small unknown frequency offset. The carrier recovery loop 700 may compensate for this small unknown frequency offset in the second recovery mode of operation or revert to the first recovery mode of operation. The carrier recovery loop 700 includes the derotator module 202, the slicer module 204, the phase error detection module 206, the loop filter module 208, the numerically controlled oscillator (NCO) module 210, the mode selector module 302, the AFC detector module 304, the input selector module 602, a feed forward equalizer (FFE) module 702, an image canceler module 704, a continuous wave (CW) canceler module 706, a first summation module 708, a first multiplier 710, a second summation module 712, a decision feedback equalizer (DFE) module 714, a phase/amplitude error detection module 716, an automatic gain control (AGC) loop filter module 718, a third summation module 720, a switching module 722, a constant modulus algorithm (CMA) error generator module 724, and a second derotator module 726.

Some features of the carrier recovery loop 700 are substantially similar to features of the carrier recovery loop 600 as discussed above; therefore, only differences between the carrier recovery loop 600 and the carrier recovery loop 700 are to be discussed in further detail.

The FFE module 702 compensates for distortion embedded onto the desired communications channel 750 by a communications channel, such as the communication channel 104 to provide an example, or any other suitable interference that will be apparent to those skilled in the relevant art(s) that is caused by one or more previous symbols of the desired communications channel 750, commonly referred to a precursor intersymbol interference, to provide a precursor compensated communications channel 752. Noise, interference, signal strength variations known as fading, phase shift variations, or multiple path delays known as multi-path propagation may introduce distortion into the transmitted communications signal. The FFE module 702 adaptively adjusts an impulse response based upon a derotated error signal 754 to compensate for this distortion in the desired communications channel 750 to produce the precursor compensated communications channel 752. The FFE module 702 adaptively adjusts the impulse response using one or more equalization coefficients in response to the derotated error signal 754. In an exemplary embodiment, the one or more equalization coefficients are adaptively updated according to a Least Mean Squared (LMS), Recursive Least Squares (RLS), Minimum Mean Squared Error (MMSE) algorithms or any suitable equivalent algorithm that yields a least-squares result that will be apparent to those skilled in the relevant art(s) without departing from the spirit and scope of the present invention.

The image canceler module 704 adjusts a phase and/or an amplitude of an image communications channel 756 to approximate the phase and/or amplitude of this image communications channel embedded within the precursor compensated communications channel 752. The image communications channel 756 may represent an unwanted image of the desired communications channel 750 that is embedded within the transmitted communications signal or a replica of this unwanted image. The image canceler module 704 adaptively adjusts an impulse response based upon the derotated error signal 754 to adjust the phase and/or the amplitude of the image communications channel 756 to provide an adjusted image communications channel 758. The image canceler module 704 adaptively adjusts the impulse response using one or more equalization coefficients in response to the derotated error signal 754. In an exemplary embodiment, the one or more equalization coefficients are adaptively updated according to a Least Mean Squared (LMS), Recursive Least Squares (RLS), Minimum Mean Squared Error (MMSE) algorithms or any suitable equivalent algorithm that yields a least-squares result that will be apparent to those skilled in the relevant art(s) without departing from the spirit and scope of the present invention.

The CW canceler module 706 filters narrowband interference characterized as having a known frequency from the derotated error signal 754 and adjusts a phase and/or an amplitude of this narrowband interference to approximate the phase and/or the amplitude of this narrowband interference embedded within the precursor compensated communications channel 752. The CW canceler module 706 adaptively adjusts an impulse response based upon the derotated error signal 754 to adjust the phase and/or the amplitude of the narrowband interference embedded within the derotated error signal 754 to provide a narrowband interference signal 760. The CW canceler module 706 adaptively adjusts the impulse response using one or more adaptive filtering coefficients in response to the derotated error signal 754. In an exemplary embodiment, the adaptive filtering coefficients are adaptively updated based upon the derotated error signal 754 according to a Least Mean Squared (LMS), Recursive Least Squares (RLS), Minimum Mean Squared Error (MMSE) algorithms or any suitable equivalent algorithm that yields a least-squares result that will be apparent to those skilled in the relevant art(s) without departing from the spirit and scope of the present invention.

The first summation module 708 combines the precursor compensated communications channel 752, the adjusted image communications channel 758, and the narrowband interference signal 760 to provide a noise reduced communications channel 762. In particular, the first summation module 708 subtracts both the adjusted image communications channel 758 and the narrowband interference signal 760 from the precursor compensated communications channel 752 to provide the noise reduced communications channel 762.

The first multiplier 710 multiplies the noise reduced communications channel 762 by an amplitude adjustment signal 764 to provide an amplitude adjusted communications channel 766. The first multiplier 710 compensates for hum modulation embedded within the noise reduced communications channel 762 by adjusting an amplitude of the noise reduced communications channel 762 using the amplitude adjustment signal 764.

The derotator module 202 adjusts the amplitude adjusted communications channel 766 according to the oscillator signal 254 to provide the derotated communication signal 252. The slicer module 204, the phase error detection module 206, the loop filter module 208, the numerically controlled oscillator (NCO) module 210, the mode selector module 302, the AFC detector module 304, and the input selector module 602 operates in a substantially similar manner as described above; however, the second summation module 712 is coupled between the derotator module 202 and the slicer module 204. The second summation module 712 combines a postcursor compensated sequence 768 and the derotated communication signal 252 to substantially remove postcursor intersymbol interference from the derotated communication signal 252 to provide a postcursor communications signal 770.

The DFE module 714 compensates for distortion embedded onto the desired communications channel 750 by the communications channel, or any other suitable source that will be apparent to those skilled in the relevant art(s) caused by one or more future symbols of the desired communications channel 750, commonly referred to a postcursor intersymbol interference, to provide the postcursor compensated sequence 768. The DFE module 714 adaptively adjusts an impulse response based upon one or more internal equalization coefficients to compensate for this distortion in the postcursor communications signal 770 to produce the postcursor compensated sequence 768. The DFE module 714 adaptively adjusts the impulse response using the one or more internal equalization coefficients which are adaptively updated according to a Least Mean Squared (LMS), Recursive Least Squares (RLS), Minimum Mean Squared Error (MMSE) algorithms or any suitable equivalent algorithm that yields a least-squares result that will be apparent to those skilled in the relevant art(s) without departing from the spirit and scope of the present invention.

The phase/amplitude error detection module 716 compares the postcursor communications signal 770 and the recovered sequence of data 256 to provide the phase error 258 and an amplitude error 772. The phase/amplitude error detection module 716 provides the phase error 258 in a substantially similar manner as the phase error detection module 206. The amplitude error 772 represents a difference between an amplitude of the postcursor communications signal 770 and an amplitude of the recovered sequence of data 256. A large value for the amplitude error 772 represents a large difference in amplitude between the postcursor communications signal 770 and the recovered sequence of data 256 while a small value for the amplitude error 772 represents a small difference in amplitude between the postcursor communications signal 770 and the recovered sequence of data 256.

The AGC loop filter module 718 filters unwanted noise from the amplitude error 772 to provide the amplitude adjustment signal 764. The AGC loop filter module 718 substantially attenuates those frequency components of the amplitude error 772 that are greater than its respective cutoff frequency while passing, with little to no attenuation, those frequency components of the amplitude error 772 that are less than its respective cutoff frequency.

The third summation network 720 combines the recovered sequence of data 256 and the postcursor communications signal 770 to provide a slicer error 774. A large value for the slicer error 774 represents a large difference between the postcursor communications signal 770 and the recovered sequence of data 256, usually caused by a large amount of noise present within the postcursor communications signal 770, while a small value for the slicer error 774 represents a small difference between the postcursor communications signal 770 and the recovered sequence of data 256.

The switch module 722 selects as a derotational error signal 776 the slicer error 774 to operate in a decision directed mode of operation or a CMA error 778 to operate in a non-decision directed, or blind, mode of operation. The CMA error generator module 724 provides the CMA error 778 as described in detail in D. N. Godard, "Self-recovering equalization and carrier tracking in two-dimensional data communication systems," IEEE Transactions on Communications, vol 28, no. 11, pp. 1867-1875, November 1980 and/or J. R. Treichler, B. G. Agee, "A new approach to multipath correction of constant modulus signals," IEEE Transactions on Acoustics, Speech, and Signal Processing, vol. ASSP-31, no. 2, pp. 459-472, April, 1983, both of which are incorporated herein by reference in their entirety.

The second derotator module 726 adjusts the oscillator signal 254 according to the derotational error signal 776 to provide the derotated error signal 754.

Further discussion of the FFE module 702, the image canceler module 704, the first summation module 708, the first multiplier 710, the second summation module 712, the decision feedback equalizer (DFE) module 714, the phase/amplitude error detection module 716, the automatic gain control (AGC) loop filter module 718, the third summation module 720, the switching module 722, the constant modulus algorithm (CMA) error generator module 724, and/or the second derotator module 726, as well as other aspects of the carrier recovery loop 700, is given in U.S. patent application Ser. No. 11/878,224, filed on Jul. 23, 2007, now U.S. Pat. No. 7,885,323, which is incorporated herein by reference in its entirety.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the invention and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. A carrier recovery loop for compensating for a frequency offset in a received communication signal, the frequency offset being relative to a transmitted communication signal, the carrier recovery loop comprising:
   a derotator module configured to adjust the received communication signal based upon an oscillator signal to compensate for the frequency offset to provide a derotated communication signal;
   an automatic frequency control (AFC) detector module configured to raise the derotated communication signal to a power of an integer to provide a sinusoidal spectral component and to determine a cross product of the sinusoidal spectral component to provide a first phase error;
   a slicer module configured to determine a most-likely transmitted sequence of the transmitted communication signal based upon the derotated communication signal to provide a recovered sequence of data;
   a phase error detector module configured to compare the derotated communication signal and the recovered sequence of data to provide a second phase error;
   a mode selector module configured to provide the first phase error from the AFC detector module in a coarse mode of operation and the second phase error from the phase error detector module in a fine acquisition mode of operation; and
   a numerically controlled oscillator (NCO) module configured to provide the oscillator signal based upon one of the first phase error and the second phase error that has been provided by the mode selector module.

2. The carrier recovery loop of claim 1, wherein the received communication signal is encoded according to a quadrature amplitude modulation (QAM) scheme.

3. The carrier recovery loop of claim 1, wherein the AFC detector module comprises:
   a transform unit configured to raise the derotated communication signal to the power of the integer to provide the sinusoidal spectral component; and
   a cross product detector configured to determine the cross product of successive samples of the sinusoidal spectral component to provide the first phase error.

4. The carrier recovery loop of claim 3, wherein the AFC detector module further comprises:
   a variable low pass filter (LPF) module, coupled between the transform unit and the cross product detector, configured to filter unwanted noise from the sinusoidal spectral component to provide a filtered spectral component,
   wherein the cross product detector is configured to determine the cross product of the filtered spectral component to provide the first phase error.

5. The carrier recovery loop of claim 4, wherein the variable LPF module is further configured to adjust its respective bandwidth as a function of time.

6. The carrier recovery loop of claim 3, wherein the cross product detector comprises:
   a first and a second delay module configured to provide a first and a second delayed spectral component based upon an in-phase component of the sinusoidal spectral component and quadrature-phase component of the sinusoidal spectral component, respectively;

a first and a second multiple module configured to multiply the first and the second delayed spectral components by the quadrature-phase component and the in-phase component, respectively, to provide a first and a second cross product, respectively; and a summation module configured to combine the first and the second cross products to provide the first phase error.

7. The carrier recovery loop of claim 1, wherein the frequency offset represents a large frequency offset wherein the second phase error cannot converge to a substantially constant value in a presence of the large frequency offset.

8. The carrier recovery loop of claim 7, wherein the mode selector module is configured to operate in the coarse mode of operation in the presence of the large frequency offset and to operate in the fine acquisition mode of operation in the presence of a small frequency offset, wherein the second phase error converges to a substantially constant value in a presence of the small frequency offset.

9. A carrier recovery loop for compensating for a frequency offset in a received communication signal, the frequency offset being relative to a transmitted communication signal, the carrier recovery loop comprising:

a derotator module configured to adjust the received communication signal based upon an oscillator signal to compensate for the frequency offset to provide a derotated communication signal;

an automatic frequency control (AFC) detector module configured to raise the derotated communication signal to a power of an integer to provide a sinusoidal spectral component and to determine a cross product of the sinusoidal spectral component to provide a phase error;

a numerically controlled oscillator (NCO) module configured to provide the oscillator signal based upon the phase error; and a mode selector module configured to provide the received communication signal to the AFC detector module in a first mode of operation and provide the derotated communication signal to the AFC detector module in a second mode of operation.

10. A method for compensating for a frequency offset in a received communication signal, the frequency offset being relative to a transmitted communication signal, the method comprising:

adjusting, by a carrier recovery loop, the received communication signal based upon an oscillator signal to compensate for the frequency offset to provide a derotated communication signal;

raising the derotated communication signal by a power of an integer to provide a sinusoidal spectral component;

determining a cross product of the sinusoidal spectral component to provide a first phase error;

determining a most-likely transmitted sequence of the transmitted communication signal based upon the derotated communication shoal to provide a recovered sequence of data;

comparing the derotated communication signal and the recovered sequence of data to provide a second phase error; and providing the first phase error as a phase error in a coarse mode of operation and the second phase error as the phase error in a fine acquisition mode of operation; and generating the oscillator signal based upon the phase error.

11. The method of claim 10, wherein the received communication signal is encoded according to a quadrature amplitude modulation (QAM) scheme.

12. The method of claim 10, wherein the determination of the cross product of the sinusoidal spectral component comprises:

determining the cross product of successive samples of the sinusoidal spectral component to provide the first phase error.

13. The method of claim 12, further comprising:

filtering unwanted noise from the sinusoidal spectral component to provide a filtered spectral component, wherein the determination of the cross product of the sinusoidal spectral component determines the cross product of the filtered spectral component to provide the first phase error.

14. The method of claim 13, further comprising:

adjusting a bandwidth of a variable low pass filter as a function of time to filter the unwanted noise from the sinusoidal spectral component.

15. The method of claim 10, wherein the determination of the cross product of the sinusoidal spectral component comprises:

delaying an in-phase component of the sinusoidal spectral component to provide a first delayed spectral component and a quadrature-phase component of the sinusoidal spectral component to provide a second delayed spectral component;

multiplying the first and the second delayed spectral components by the quadrature-phase component and the in-phase component, respectively, to provide a first and a second cross product; and combining the first and the second cross products to provide the first phase error.

16. The method of claim 10, wherein the frequency offset represents a large frequency offset wherein the second phase error cannot converge to a substantially constant value in a presence of the large frequency offset.

17. The method of claim 16, wherein the providing comprises:

operating in the coarse mode of operation in the presence of the large frequency offset or operating in the fine acquisition mode of operation in the presence of a small frequency offset, wherein the second phase error converges to a substantially constant value in a presence of the small frequency offset.

18. The method of claim 10, further comprising:

providing the received communication signal to the adjustment step in a first mode of operation and providing the derotated communication signal to the adjustment step in a second mode of operation.

19. A carrier recovery loop, comprising:

a phase error detector module configured to compare a derotated communication signal and a recovered sequence of data to provide a first phase error, wherein the recovered sequence of data is based on a comparison of the derotated communication signal and a threshold value;

an automatic frequency control (AFC) detector module configured to raise the derotated communication signal to a power of an integer to provide a sinusoidal spectral component and to determine a cross product of the sinusoidal spectral component to provide a second phase error;

a mode selector module configured to select the first phase error from the phase error detector module in a first mode of operation and the second phase error from the AFC detector module in a second mode of operation; and a numerically controlled oscillator (NCO) module configured to generate an oscillator signal based upon the selection of the mode selector module.

20. The carrier recovery loop of claim 19, further comprising:

a second mode selector module configured to provide the received communication signal to the AFC detector module in a third mode of operation and provide the derotated communication signal to the AFC detector module in a fourth mode of operation.

* * * * *

UNITED STATES PATENT AND TRADEMARK OFFICE
CERTIFICATE OF CORRECTION

PATENT NO. : 8,638,889 B2
APPLICATION NO. : 13/169965
DATED : January 28, 2014
INVENTOR(S) : Currivan et al.

Page 1 of 1

It is certified that error appears in the above-identified patent and that said Letters Patent is hereby corrected as shown below:

In the Claims

Column 17, line 56, please replace "shoal" with --signal--.

Signed and Sealed this
Third Day of June, 2014

Michelle K. Lee
*Deputy Director of the United States Patent and Trademark Office*